United States Patent
Lu

(10) Patent No.: US 10,305,469 B2
(45) Date of Patent: May 28, 2019

(54) INPUT/OUTPUT CIRCUIT

(71) Applicant: MStar Semiconductor, Inc., Hsinchu, Hsien (TW)

(72) Inventor: Wen cai Lu, Shanghai (CN)

(73) Assignee: MSTAR SEMICONDUCTOR, INC., Hsinchu, Hsien (TW)

( * ) Notice: Subject to any disclaimer, the term of this patent is extended or adjusted under 35 U.S.C. 154(b) by 0 days.

(21) Appl. No.: 16/027,436

(22) Filed: Jul. 5, 2018

(65) Prior Publication Data

US 2019/0068183 A1 Feb. 28, 2019

(30) Foreign Application Priority Data

Aug. 31, 2017 (CN) .......................... 2017 1 0771433

(51) Int. Cl.
- *H03K 17/16* (2006.01)
- *H03K 17/0812* (2006.01)
- *H03K 17/081* (2006.01)

(52) U.S. Cl.
CPC ..... *H03K 17/162* (2013.01); *H03K 17/08104* (2013.01); *H03K 17/08122* (2013.01)

(58) Field of Classification Search
CPC .............. H03K 17/08; H03K 17/081; H03K 17/08104; H03K 17/0812; H03K 17/08122; H03K 17/16; H03K 17/161; H03K 17/162
USPC ........................................ 327/379, 389, 391
See application file for complete search history.

(56) References Cited

U.S. PATENT DOCUMENTS

| 5,689,209 | A | * | 11/1997 | Williams | ............... | H02J 7/0031 |
| | | | | | | 327/425 |
| 5,844,425 | A | * | 12/1998 | Nguyen | ........... | H03K 19/00315 |
| | | | | | | 326/58 |
| 6,265,926 | B1 | * | 7/2001 | Wong | ............... | H03K 19/00315 |
| | | | | | | 326/81 |
| 6,348,831 | B1 | * | 2/2002 | Baba | ................. | H03K 17/04106 |
| | | | | | | 327/408 |
| 6,351,158 | B1 | * | 2/2002 | Shearon | ........... | H03K 19/00315 |
| | | | | | | 326/22 |
| 6,861,874 | B1 | * | 3/2005 | Chen | ................. | H03K 19/00315 |
| | | | | | | 326/81 |
| 9,461,545 | B2 | | 10/2016 | Zhang et al. | | |
| 2001/0046156 | A1 | * | 11/2001 | Miyazaki | ............... | G11C 5/143 |
| | | | | | | 365/156 |
| 2004/0113676 | A1 | * | 6/2004 | Shin | ................. | H03K 19/00315 |
| | | | | | | 327/308 |

(Continued)

*Primary Examiner* — William Hernandez
(74) *Attorney, Agent, or Firm* — McClure, Qualey & Rodack, LLP

(57) ABSTRACT

An input/output circuit includes a first switch element, a control voltage providing circuit and a floating voltage providing circuit. The first switch element includes a control terminal, a first path terminal, a second path terminal and a base terminal. The first path terminal receive a first voltage, and the second path terminal receives a second voltage. The control voltage providing circuit provides a control voltage to the control terminal of the first switch element. The floating voltage providing circuit provides the larger between the first voltage and the second voltage to the base terminal of the first switch element, so as to prevent a leakage current from being generated between the first voltage source or the second voltage source and the base terminal of the first switch element.

17 Claims, 8 Drawing Sheets

(56) References Cited

U.S. PATENT DOCUMENTS

| | | | |
|---|---|---|---|
| 2009/0002028 A1* | 1/2009 | Ker | H03K 19/00315 326/80 |
| 2015/0035582 A1* | 2/2015 | Maxim | H03K 17/302 327/382 |
| 2016/0065066 A1* | 3/2016 | Zhang | H02M 3/158 323/271 |
| 2016/0099642 A1* | 4/2016 | Okamoto | H03K 17/162 323/271 |

* cited by examiner

INPUT/OUTPUT CIRCUIT

This application claims the benefit of China Patent application Serial No. 201710771433.0, filed Aug. 31, 2017, the subject matter of which is incorporated herein by reference.

BACKGROUND OF THE INVENTION

Field of the Invention

The invention relates to a signal transmission circuit, and more particularly to an input/output circuit.

Description of the Related Art

An input/output circuit serves as a bridge for signal transmission, and is extensively applied tin various types of electronic devices. In a current input/output circuit, a PMOS or NMOS transistor is often adopted as a switch element for outputting a corresponding voltage when the PMOS or NMOS transistor is conducted. FIG. 1 shows a common input/output circuit in the prior art. As shown in FIG. 1, a current input/output circuit 10 includes a switch element 11, a first voltage source AVDD, a second voltage source PAD and a resistor 12. The switch element 11 is an MOS transistor, and has one of the drain and source thereof connected to the first voltage source AVDD and the other of the two connected to the second voltage PAD through the resistor 12, and the gate thereof receiving a control signal to determine whether to conduct the switch element 11.

In the input/output circuit 10 in FIG. 1, because the first voltage source AVDD and the second voltage source PAD switch between a low voltage (0 V) and a high voltage (3.3 V), the switch element 11 is frequently implemented by a PMOS transistor so as to prevent a situation where an NMOS cannot be activated when the voltage at the source or drain thereof is the high voltage 3.3 V.

The switch element 11 usually has a base terminal FLOAT, which is commonly electrically connected to one of the source and the drain of the switch element 11. However, because the first voltage source AVDD and the second voltage source PAD switch between the low voltage 0 V and the high voltage 3.3 V, while the base terminal FLOAT of the switch element 11 is electrically connected to the source or the drain electrically connected to the first voltage source AVDD, when the first voltage source AVDD is the low voltage 0V and the second voltage source PAD is the high voltage 3.3 V, the voltage $V_{FLOAT}$ at the base terminal FLOAT of the switch element 11 is also 0V. At this point, a leakage current is caused between the second voltage source PAD and the base terminal FLOAT of the switch element 11. Similarly, while the base terminal FLOAT of the switch element 11 is electrically connected to the source or the drain electrically connected to the second voltage source PAD, when the second voltage source PAD is the low voltage 0V and the first voltage source AVDD is the high voltage 3.3 V, the voltage $V_{FLOAT}$ at the base terminal FLOAT of the switch element 11 is also 0 V. At this point, a leakage current is also caused between the first voltage source AVDD and the base terminal FLOAT of the switch element 11. The presence of the leakage current severely damages electronic components, leading to malfunction of the entire circuit.

In view of the above, there is a need for an input/output circuit capable of preventing a leakage current between the first voltage source AVDD or the second voltage source PAD and the base terminal FLOAT of the switch element 11.

SUMMARY OF THE INVENTION

The main technical problem to be resolved by the present invention is how to provide an input/output circuit capable of effectively overcoming the issue of a leakage current easily occurring between a voltage source and a base terminal of a switch element in a conventional input/output circuit.

To resolve the above technical problem, the present invention provides an input/output (I/O) circuit including a first switch element, a control voltage providing circuit and a floating voltage providing circuit. The first switch element includes a control terminal, a first path terminal, a second path terminal and a base terminal. The first path terminal is electrically connected to a first voltage source to receive a first voltage provided by the first voltage source, and the second path terminal is electrically connected to a second voltage source to receive a second voltage provided by the second voltage source. The control voltage providing circuit is electrically connected to the control terminal of the first switch element to provide a control voltage to the control terminal of the first switch element, so as to control whether to conduct the first switch element. The floating voltage providing circuit is electrically connected to the base terminal of the first switch element to provide the larger between the first voltage and the second voltage to the base terminal of the first switch element, so as to prevent a leakage current from being generating between the first voltage source or the second voltage source and the base terminal of the first switch element.

The present invention provides the following effects. Different from the prior art, in the input/output circuit of the present invention, a floating voltage is provided to a base terminal of the switch element by a floating voltage providing circuit, and the floating voltage is always the larger between a first voltage source provided by a first voltage source and a second voltage source provided by a second voltage source. Thus, it can be ensured that the base terminal of the switch element stays constantly shorted at all times with one of the first voltage source and the second voltage source that provides the larger voltage between the two. Therefore, regardless that the first voltage provided by the first voltage source and the second voltage provided by the second voltage source both need to switch between a high voltage of 3.3 V and a low voltage of 0 V, the present invention is capable of effectively preventing a leakage current being generated between the first voltage source or the second voltage source and the base terminal of the switch element.

The above and other aspects of the invention will become better understood with regard to the following detailed description of the preferred but non-limiting embodiments. The following description is made with reference to the accompanying drawings.

DETAILED DESCRIPTION OF THE INVENTION

Specific details are given below to fully understand the present invention. However, the present invention can be implemented by various other different methods, and similar modifications may be made by a person skilled in the art without departing from the spirit of the present invention. Thus, the present invention is not to be construed as being limited by the non-embodiments disclosed below.

For the abovementioned problems of the prior art, the present invention provides an input/output circuit, which is to be described in detail with the accompanying drawings below.

Figure 2:
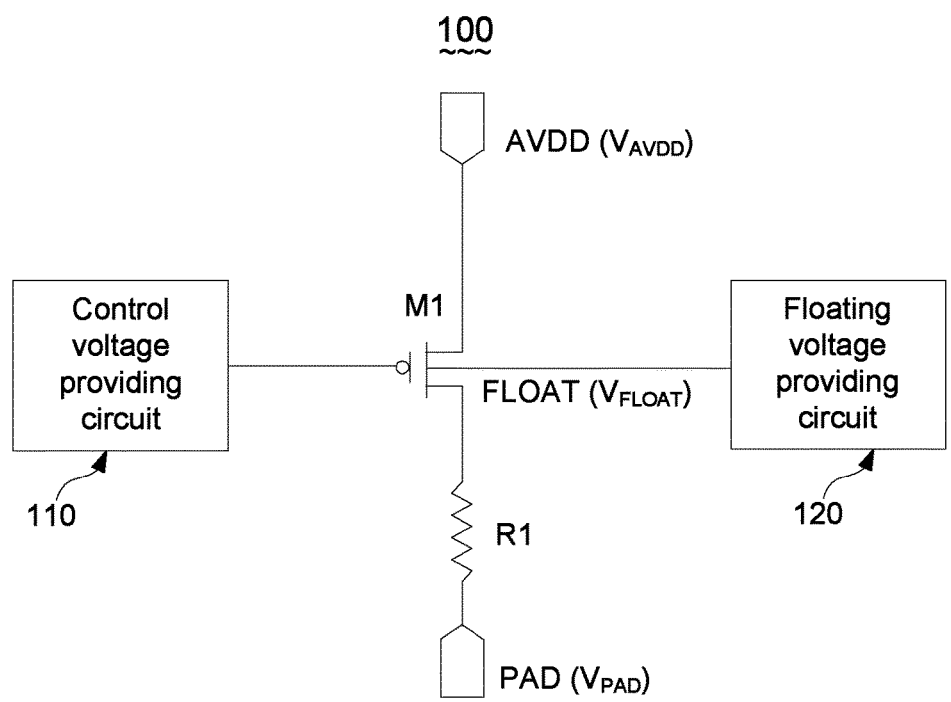
FIG. 2 is a schematic diagram of an input/output circuit according to an embodiment of the present invention.

FIG. 2 shows a schematic diagram of an input/output circuit according to an embodiment of the present invention. As shown in FIG. 2, the input/output circuit 100 of this embodiment includes a switch element M1, a first voltage source AVDD, a second voltage source PAD, a control voltage providing circuit 110 and a floating voltage providing circuit 120.

The switch element M1 may be implemented by a MOS transistor, e.g., a PMOS transistor, and includes a control terminal (the gate), a first path terminal (one of the source and the drain), a second path terminal (the other of the source and the drain), and a base terminal FLOAT. The first path terminal of the switch element M1 is electrically connected to the first voltage source AVDD to receive a first voltage $V_{AVDD}$ provided by the first voltage source AVDD, and the second path terminal may be electrically connected to the second voltage source PAD through a resistor R1 so as to receive a second voltage $V_{PAD}$ provided by the second voltage source PAD.

The control voltage providing circuit 110 is electrically connected to the control terminal of the switch element M1 to provide a control voltage to the control terminal of the switch element M1, so as to control whether to conduct the switch element M1.

The floating voltage providing circuit 120 is electrically connected to the base terminal FLOAT of the switch element M1 to provide the floating voltage $V_{FLOAT}$ to the base terminal FLOAT of the switch element M1. The floating voltage $V_{FLOAT}$ is the larger between the first voltage $V_{AVDD}$ and the second voltage $V_{PAD}$, so as to prevent a leakage current from being generated between the first voltage source AVDD or the second voltage source PAD and the base terminal FLOAT of the switch element M1.

The first voltage $V_{AVDD}$ provided by the first voltage source AVDD and the second voltage $V_{PAD}$ provided by the second voltage source PAD both switch between the high voltage (3.3 V) and the low voltage (0 V).

When the first voltage $V_{AVDD}$ provided by the first voltage AVDD is the high voltage 3.3 V and the second voltage $V_{PAD}$ provided by the second voltage source PAD is the low voltage 0V, whether the switch element M1 is to be conducted is determined according to the control voltage received at the control terminal of the switch element M1. When the control voltage provided by the control voltage providing circuit 110 is the high voltage 3.3 V, the switch element M1 is cut off; when the control voltage provided by the control voltage providing circuit 110 is the low voltage 0 V, the switch element M1 is conducted. At this point, the current flows from the first voltage source AVDD through the conducted switch element M1 and the resistor R1 to the second voltage source PAD. At this point, because the floating voltage $V_{FLOAT}$ received at the base terminal FLOAT of the switch element M1 is the larger between the first voltage $V_{AVDD}$ and the second voltage $V_{PAD}$, i.e., the first voltage $V_{AVDD}$ (the high voltage 3.3V), it is equivalent to that the first voltage source AVDD providing the high voltage 3.3V and the base terminal FLOAT of the switch element M1 are shorted, and so no leakage current is generated between the first voltage source AVDD and the base terminal FLOAT of the switch element M1.

Similarly, when the first voltage $V_{AVDD}$ provided by the first voltage source AVDD is the low voltage 0 V and the second voltage $V_{PAD}$ provided by the second voltage source PAD is the high voltage 3.3 V, whether the switch element M1 is conducted is determined according to the control voltage received at the control terminal of the switch element M1. When the control voltage provided by the control voltage providing circuit 110 is the high voltage 3.3 V, the switch element M1 is cut off; when the control voltage provided by the control voltage providing circuit 110 is the low voltage 0 V, the switch element M1 is conducted, and the current flows from the second voltage source PAD through the resistor R1 and the conducted switch element M1 to the first voltage source AVDD. At this point, the floating voltage $V_{FLOAT}$ received at the base terminal FLOAT of the switch element M1 is the larger between the first voltage $V_{AVDD}$ and the second voltage $V_{PAD}$, i.e., the second voltage $V_{PAD}$ (the high voltage 3.3 V), i.e., the second voltage source PAD providing the high voltage 3.3 V and the base terminal FLOAT of the switch element M1 are shorted, and so no leakage current is generated between the second voltage source PAD and the base terminal FLOAT of the switch element M1.

When the first voltage $V_{AVDD}$ provided by the first voltage source AVDD is the high voltage 3.3 V and the second voltage $V_{PAD}$ provided by the second voltage source PAD is also the high voltage 3.3 V, whether the switch element M1 is conducted is determined according to the control voltage received at the control terminal of the switch element M1. At this point, the floating voltage $V_{FLOAT}$ received by the base terminal FLOAT of the switch element M1 is the larger between the first voltage $V_{AVDD}$ and the second voltage $V_{PAD}$, i.e., the first high voltage 3.3 V, it is equivalent to that the first voltage source AVDD, the second voltage source PAD and the base terminal FLOAT of the switch element M1 are shorted together, and so no leakage current is generated between either the first voltage source AVDD or the second voltage source PAD and the base terminal FLOAT of the switch element M1.

That is to say, in the present invention, the base terminal FLOAT of the switch element M1, instead of being purely electrically connected to one of the source and the drain of the switch element M1 to receive the voltage signal provided by the first voltage source AVDD or the second voltage source PAD, receives the larger between the first voltage $V_{AVDD}$ provided by the first voltage source AVDD and the second voltage $V_{PAD}$ provided by the second voltage source PAD, so as to ensure that the base terminal FLOAT of the switch element M1 is constantly shorted at all times with one of the first voltage source AVDD and the second voltage source PAD that provides the larger voltage between the two. Therefore, regardless that the first voltage $V_{AVDD}$ provided by the first voltage source AVDD and the second voltage $V_{PAD}$ provided by the second voltage source PAD both switch between the high voltage 3.3 V and the low voltage 0V, the present invention is capable of effectively preventing any leakage current from being generated between the first voltage source AVDD or the second voltage source PAD and the base terminal FLOAT of the switch element M1.

Figure 1:
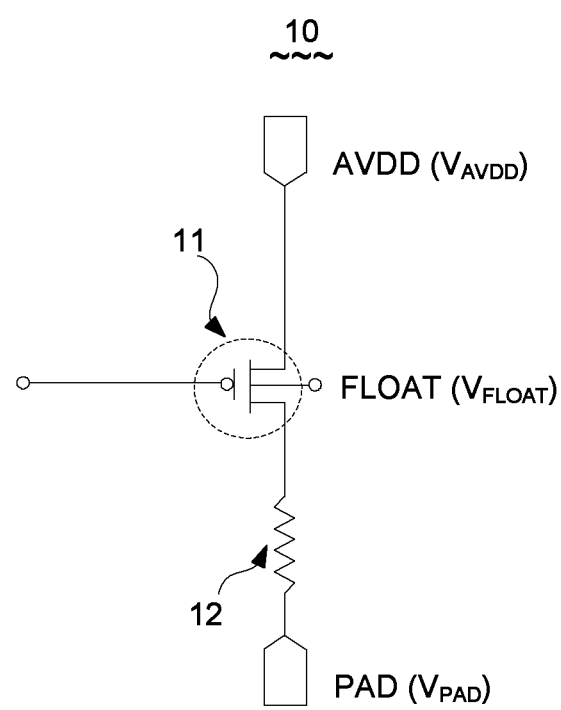
FIG. 1 is a common input/output circuit in the prior art.
Figure 3:
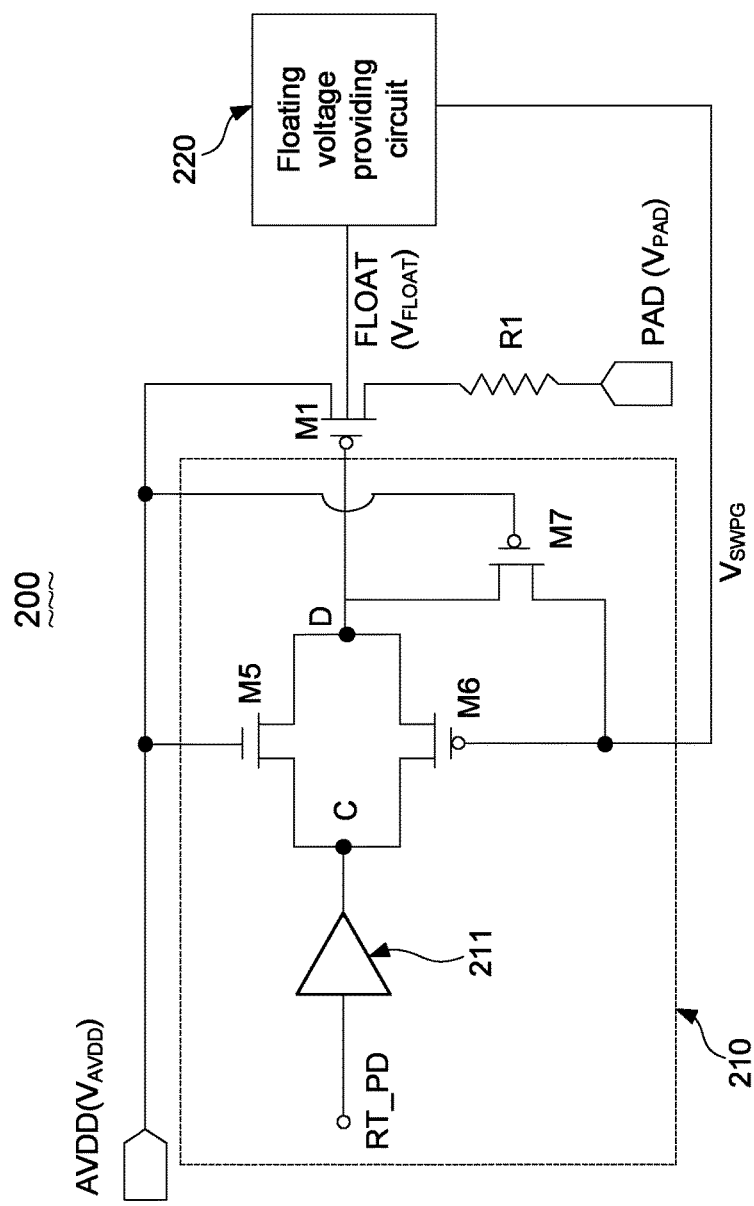
FIG. 3 is a schematic diagram of an input/output circuit according to another embodiment of the present invention.
Figure 4:
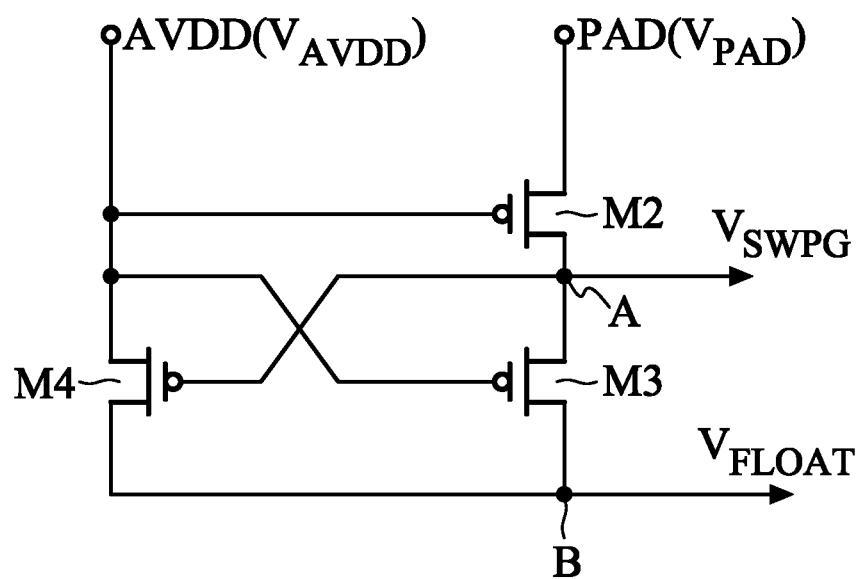
FIG. 4 is a schematic diagram of a floating voltage providing circuit in FIG. 3.

Referring to FIG. 3 and FIG. 4, FIG. 3 shows a schematic diagram of an input/output circuit according to another embodiment of the present invention; FIG. 4 shows a schematic diagram of a floating voltage providing circuit in FIG. 3. As shown in FIG. 3, the input/output circuit 200 of this embodiment is similar to the input/output circuit 100 in FIG. 1, and includes a switch element M1, a first voltage source AVDD, a second voltage source PAD, a control voltage providing circuit 210 and a floating voltage providing circuit 220. In this embodiment, the switch element M1 is a first-type device, and the components in the control voltage providing circuit 210 and the floating voltage providing circuit 220 are all first-type devices. The first-type device is a device capable of withstanding a high voltage difference, e.g., a device capable of withstanding a 3.3-V voltage difference.

More specifically, referring to FIG. 4, the floating voltage providing circuit 220 of this embodiment includes switch elements M2 to M4. A person skilled in the art can understand that each switch element described below includes a control terminal, a first path terminal and a second path terminal, and may be implemented by a transistor. The control terminal of the switch element refers to the gate of the transistor, the first path terminal of the switch element refers to one of the source and the drain of the transistor, and the second path terminal of the switch element refers to the other of the source and the drain of the transistor. In this embodiment, the switch elements M2 to M4 may each be implemented by a PMOS transistor.

The control terminal of the switch element M2 is electrically connected to the first voltage source AVDD to receive a first voltage $V_{AVDD}$, and the first path terminal thereof is electrically connected to the second voltage source PAD to receive a second voltage $V_{PAD}$. The control end of the third switch element M3 is also electrically connected to the first voltage source AVDD to receive the first voltage $V_{AVDD}$, and the first path terminal thereof is electrically connected to the second path terminal of the switch element M2 at a connecting position, which may be defined as a node A. The control terminal of the switch element M4 is electrically connected to the node A, the first path terminal thereof is electrically connected to the first voltage source AVDD to receive the first voltage $V_{AVDD}$, and the second path terminal thereof is electrically connected to the second path terminal of the switch element M3 at a connecting position, which may be defined as a node B. The node B serves as a first output terminal of the floating voltage providing circuit 220, so as to output the floating voltage $V_{FLOAT}$ to the base terminal of the switch element M1 in FIG. 3. Further, the node A may serve as a second output terminal of the floating voltage providing circuit 220 to output a voltage $V_{SWPG}$ at the node A.

Referring to FIG. 3, the control voltage providing circuit 210 of this embodiment includes switch elements M5 to M7 and a buffer 211. The switch element M5 may be implemented by an NMOS transistor, and the switch elements M6 and M7 may be implemented by PMOS transistors.

A control terminal of the switch element M5 is electrically connected to the first voltage source AVDD to receive the first voltage $V_{AVDD}$, and a first path terminal of the switch element M5 is electrically connected to a first path terminal of the switch element M6 at a connecting position, which may be defined as a node C. A second path terminal of the switch element M5 is connected to a second path terminal of the switch element M6 at a connecting position, which may be defined as a node D. A control terminal of the switch element M6 is electrically connected to the second output terminal of the floating voltage providing circuit 220 to receive the voltage $V_{SWPG}$ at the node A.

An input terminal of the buffer 211 is for receiving a control voltage RT_PD, and an output terminal thereof is electrically connected to the node C.

A control terminal of the switch element M7 is electrically connected to the first voltage source AVDD to receive the first voltage $V_{AVDD}$, a first path terminal thereof is electrically connected to the node D, and a second path terminal thereof is electrically connected to the control terminal of the switch element M6.

Operation principles of the input/output circuit of this embodiment are given in detail below.

Referring to FIG. 3 and FIG. 4, when the first voltage VAVDD provided by the first voltage source AVDD is the high voltage 3.3 V, regardless of whether the second voltage VPAD provided by the second voltage source PAD is the low voltage 0 V or the high voltage 3.3 V, in the floating voltage providing circuit 220, the switch elements M2 and M3 are both cut off and the switch element M4 is conducted. Because the switch element M4 is conducted, the first voltage $V_{AVDD}$ is transmitted through the conducted switch element M4 to the node B; that is to say, the floating voltage $V_{FLOAT}$ outputted by the floating voltage providing circuit 220 is the first voltage $V_{AVDD}$ at the high voltage 3.3 V.

Further, because the switch elements M2 and M3 are cut off, the node A in the floating voltage providing circuit 220 cannot be charged, and so the voltage $V_{SWPG}$ at the node A is lower. At this point, as shown in FIG. 3, the control terminal of the switch element M5 in the control voltage providing circuit 210 receives the first voltage $V_{AVDD}$ at the high voltage 3.3 V, and thus the switch element M5 is conducted. Further, the control terminal of the switch element M6 receives the voltage $V_{SWPG}$ that is at a lower voltage at the node A, and the switch element M6 is also conducted. Therefore, at this point, because both of the switch elements M5 and M6 are conducted, the control voltage RT_PD passes the buffer 211 as well as the conducted switch elements M5 and M6 and is transmitted to the control terminal of the switch element M1 to control whether to conduct the switch element M1. In this embodiment, the control voltage RT_PD may switch between the high voltage 3.3 V and the low voltage 0 V.

At this point, the floating voltage $V_{FLOAT}$ outputted by the floating voltage providing circuit 220 and received by the base terminal FLOAT of the switch element M1 is equal to the first voltage $V_{AVDD}$ at the high voltage 3.3 V, i.e., the first voltage source AVDD providing the high voltage 3.3 V and the base terminal of the first switch element M1 are shorted, and thus no leakage current is generated between the first voltage source AVDD and the base terminal of the switch element M1.

Similarly, when the first voltage $V_{AVDD}$ provided by the first voltage source AVDD is the low voltage 0 V and the second voltage $V_{PAD}$ provided by the second voltage source PAD is the high voltage 3.3 V, the switch elements M2 and M3 in the floating voltage providing circuit 220 are conducted and the switch element M4 is cut off. Because the switch elements M2 and M3 are conducted, the second voltage $V_{PAD}$ passes through the conducted switch elements M2 and M3 and is transmitted to the node B, and the floating voltage $V_{FLOAT}$ provided by the floating voltage providing circuit 220 is the second voltage $V_{PAD}$ at the high voltage 3.3 V.

Further, because the switch element M2 is conducted, the voltage $V_{SWPG}$ at the node A in the floating voltage providing circuit 220 is also the high voltage 3.3 V. At this point, as shown in FIG. 3, the control terminal of the switch element M5 in the control voltage providing circuit 210 is the first voltage $V_{AVDD}$ at the low voltage 0 V, and thus the switch element M5 is cut off; the control terminal of the switch element M6 receives the voltage $V_{SWPG}$ that is the high voltage 3.3 V at the node A, and thus the switch element M6 is cut off.

The control terminal of the switch element M7 receives the first voltage $V_{AVDD}$ at the low voltage 0 V, and the second path terminal thereof receives the voltage $V_{SWPG}$ that is at the high voltage 3.3 V at the node A, and thus the switch element M7 is conducted. At this point, the control voltage RT_PD cannot be transmitted to the control terminal of the switch element M1, and the switch element M7 is however conducted. Accordingly, the voltage $V_{SWPG}$ that is the high voltage 3.3 V at the node A and received by the second path terminal of the switch element M7 passes through the conducted switch element M7 and is transmitted to the control terminal of the switch element M1 to cut off the switch element M1.

At this point, the floating voltage $V_{FLOAT}$ outputted by the floating voltage providing circuit 220 and received by the base terminal FLOAT of the switch element M1 is equivalently the second voltage $V_{PAD}$ at the high voltage 3.3 V. Thus, regardless that the second voltage $V_{PAD}$ provided by the second voltage source PAD is the high voltage 3.3 V, the second voltage source PAD and the base terminal FLOAT of the switch element M1 are equivalently shorted, and thus no leakage current is generated between the second voltage source PAD and the base terminal of the switch element M1. Therefore, in this embodiment, the floating voltage $V_{FLOAT}$ provided by the floating voltage providing circuit 220 is the larger between the first voltage $V_{AVDD}$ provided by the first voltage source AVDD and the second voltage $V_{PAD}$ provided by the second voltage source PAD, i.e., the high voltage 3.3 V, thereby effectively preventing any leakage current from being generated between the first voltage source AVDD or the second voltage source PAD and the base terminal of the switch element M1.

Further, in this embodiment, in regard to the components in the switch element M1, the control voltage providing circuit 210 and the floating voltage providing circuit 220, any two terminals of each of these components need to withstand a 3.3-V voltage difference, and thus these devices need to be first-type devices capable of withstanding a high voltage, i.e., devices capable of withstanding a 3.3-V voltage difference, so as to ensure that the input/output circuit 200 of this embodiment can stay functional.

For example, the first voltage $V_{AVDD}$ received by the first path terminal of the switch element M1 from the first voltage source AVDD switches between the high voltage 3.3 V and the low voltage 0 V, the control voltage RT_PD received by the control terminal of the first switch element M1 also switches between the high voltage 3.3 V and the low voltage 0 V, and the second voltage $V_{PAD}$ received by the second path terminal of the switch element M1 from the second voltage source PAD also switches between the high voltage 3.3 V and the low voltage 0V. Thus, the switch element M1 needs to withstand a 3.3-V voltage difference, and needs to implemented by a first-type device capable of withstanding a high voltage.

Similarly, for the switch element M2 in the floating voltage providing circuit 220, when the first voltage $V_{AVDD}$ is the high voltage 3.3 V and the second voltage $V_{PAD}$ is the low voltage 0 V, the control terminal of the switch element M2 receives the first voltage $V_{AVDD}$ at the high voltage 3.3 V and the first path terminal thereof receives the second voltage $V_{PAD}$ at the low voltage 0 V. Thus, the switch element M2 is conducted and the control terminal and the first path terminal of the switch element M2 need to withstand a 3.3-V voltage difference, and accordingly the switch element M1 needs be implemented by a first-type device capable of withstanding a high voltage.

Similarly, other components in the input/output device 200 of this embodiment need to be implemented by first-type devices capable of withstanding a high voltage so as to withstand a 3.3-V voltage difference. Such repeated operation details are omitted herein.

Figure 5:
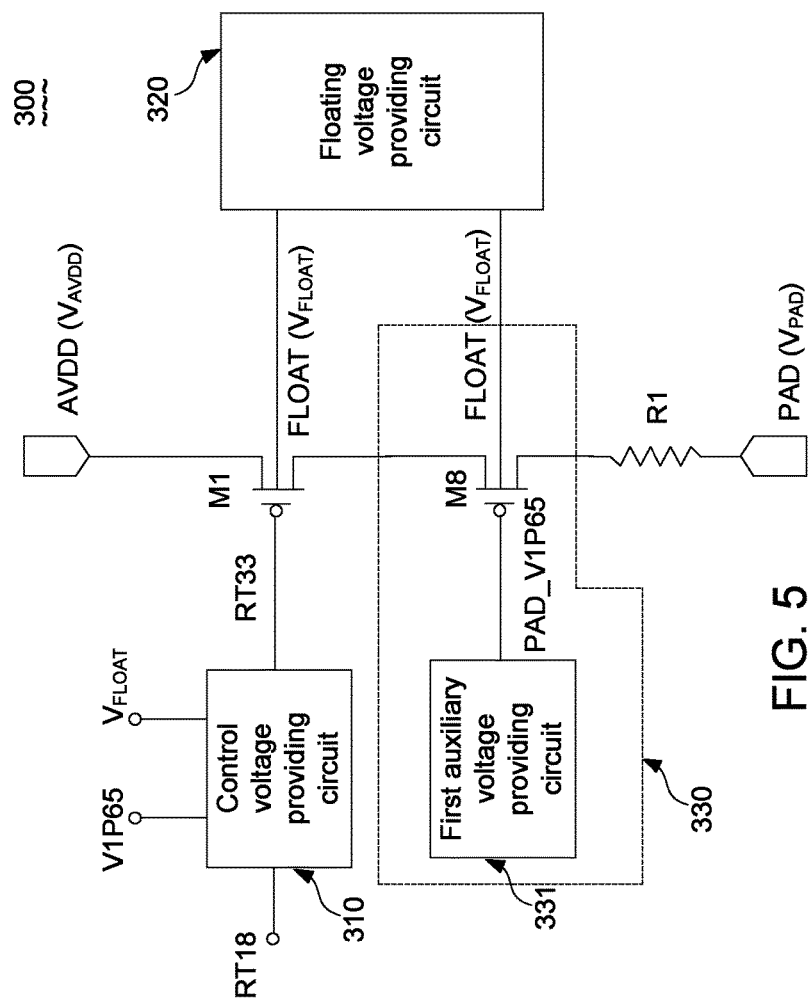
FIG. 5 is a schematic diagram of an input/output circuit according another embodiment of the present invention.

FIG. 5 shows a schematic diagram of an input/output circuit according to another embodiment of the present invention. As shown in FIG. 5, the input/output circuit 300 of this embodiment is similar to the input/output circuit 100 in FIG. 1, and also includes a switch element M1, a first voltage source AVDD, a second voltage source PAD, a control voltage providing circuit 310 and a floating voltage providing circuit 320. In this embodiment, the components in the input/output circuit 300 are all second-type devices, which, instead of being required to withstand a high voltage difference, only need to need to withstand a low voltage difference, e.g., a 1.8-V voltage difference.

In this embodiment, the input/output circuit 300 may further include a protection circuit 330, which is provided between the second path terminal of the switch element M1 and the second voltage source PAD to prevent the switch element M1 from having to withstand a voltage difference greater than 1.8 V.

The protection circuit 330 may include a first auxiliary voltage providing circuit 331 and a switch element M8. The first auxiliary voltage providing circuit 331 provides a first auxiliary voltage PAD_V1P65. The switch element M8 is similar to the switch element M1, and is also provided in a loop consisting of the first voltage source AVDD, the switch element M1 and the second voltage source PAD. Thus, the base terminal FLOAT of the switch element M8 also needs to be taken into account, so as to prevent any leakage current from being generated between the first voltage source AVDD or the second voltage source PAD and the base terminal of the switch element M8. More specifically, a control terminal of the switch element M8 is electrically connected to the first auxiliary voltage providing circuit 331 to receive the first auxiliary voltage PAD_V1P65, so as to further determine whether to conduct the switch element M8 according to the first auxiliary voltage PAD_V1P65. A first path terminal of the switch element M8 is electrically connected to the second path terminal of the switch element M1, and a second path terminal thereof is electrically connected to the second voltage source PAD to receive the second voltage $V_{PAD}$. Further, a base terminal of the switch element M8 is similar to that of the switch element M1, and also needs to be electrically connected to the floating voltage providing circuit 320 to receive the larger between the first voltage $V_{AVDD}$ and the second voltage $V_{PAD}$, so as to prevent any leakage current from being generated between the first voltage source AVDD or the second voltage source PAD and the base terminal of the switch element M8.

Figure 6:
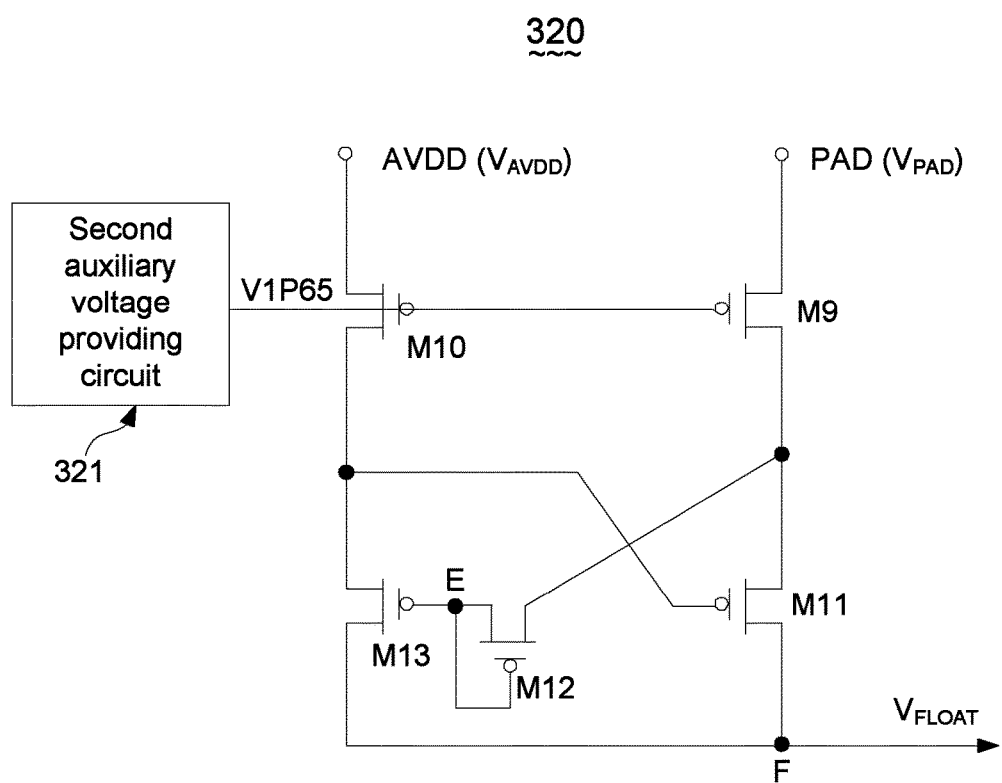
FIG. 6 is a schematic diagram of a floating voltage providing circuit in FIG. 5.

FIG. 6 shows a schematic diagram of the floating voltage providing circuit 320. As shown in FIG. 6, the floating voltage providing circuit 320 includes switch elements M9 to M13 and a second auxiliary voltage providing circuit 321. In this embodiment, the switch elements M9 to M11 may each by implemented by a PMOS transistor.

More specifically, a first path terminal of the switch element M9 is electrically connected to the second voltage source PAD to receive the second voltage $V_{PAD}$, and a first path terminal of the switch element M10 is electrically connected to the first voltage source AVDD to receive the first voltage $V_{AVDD}$. Control terminals of the switch element M9 and the switch element M10 are electrically connected together and are both electrically connected to the second auxiliary voltage providing circuit 321, so as to receive a second auxiliary voltage V1P65 provided by the second auxiliary voltage providing circuit 321. A first path terminal of the switch element M11 is electrically connected to a second path terminal of the switch element M9. A first path terminal of the switch element M12 is electrically connected to a connecting position of a second path terminal of the switch element M9 and the first path terminal of the switch element M11, and a control terminal of the switch element M12 is electrically connected to the second path terminal at a connecting position, which is defined as a node E. A control terminal of the switch element M13 is electrically connected to the node E, and a first path terminal of the switch element 13 is electrically connected to a second path terminal of the switch element M10. A control terminal of the switch element M11 is electrically connected to a connecting position of the second path terminal of the switch element M10 and the first path terminal of the switch element M13, and a second path terminal of the switch element M11 and a second path terminal of the switch element M13 are connected at a connecting position, which is defined as a node F. The node F serves as an output terminal of the floating voltage providing circuit 320 to output the floating voltage $V_{FLOAT}$ to the base terminals FLOAT of the switch elements M1 and M9, and the floating voltage $V_{FLOAT}$ is the larger between the first voltage $V_{AVDD}$ and the second voltage $V_{PAD}$.

Figure 7:
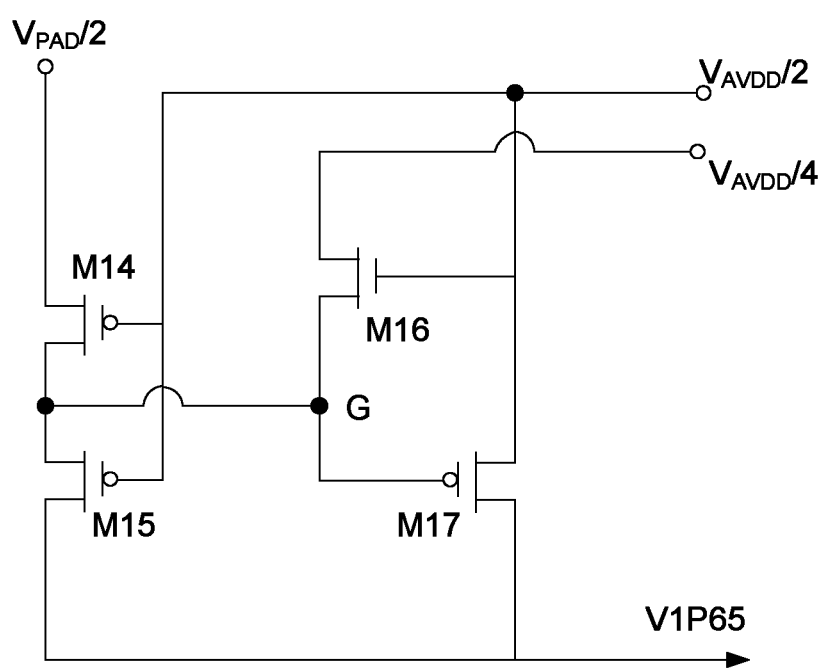
FIG. 7 is a schematic diagram of a second auxiliary voltage providing circuit in FIG. 6.

FIG. 7 shows a schematic diagram of the second auxiliary voltage providing circuit 321 shown in FIG. 6. As shown in FIG. 7, the second auxiliary voltage providing circuit 321 includes switch elements M14 to M17. In this embodiment, the switch elements M14, M15 and M17 may each be implemented by a PMOS transistors, and the switch element M16 may be implemented by an NMOS transistor.

Specifically, a first path terminal of the switch element M14 is for receiving a first derivative voltage $V_{PAD}/2$, which is derived from the second voltage $V_{PAD}$ provided by the second voltage source PAD and may be obtained by processing the second voltage $V_{PAD}$ (e.g., a division process). In this embodiment, the first derivative voltage $V_{PAD}/2$ is one-half of the second voltage $V_{PAD}$.

A first path terminal of the switch element M15 is electrically connected to a second path terminal of the switch element M14, and a control terminal of the switch element M14 and a control terminal of the switch element M15 may be electrically connected together to receive a second derivative voltage $V_{AVDD}/2$, which is derived from the first voltage $V_{AVDD}$ provided by the first voltage source AVDD and may be obtained by processing the first voltage $V_{AVDD}$ (e.g., a division process). In this embodiment, the second derivative voltage $V_{AVDD}/2$ is one-half of the first voltage $V_{AVDD}$.

A control terminal of the switch element M16 is for receiving the second derivative voltage $V_{AVDD}/2$, and a first path terminal thereof is for receiving a third derivative voltage $V_{AVDD}/4$. Similarly, the third derivative voltage $V_{AVDD}/4$ is derived from the first voltage $V_{AVDD}$ provided by the first voltage source AVDD and may be obtained by processing the first voltage $V_{AVDD}$ (e.g., a division process).

In this embodiment, the second derivative voltage $V_{AVDD}/4$ is one-quarter of the first voltage $V_{AVDD}$.

A control terminal of the switch element M17 and a second path terminal of the switch element M16 are electrically connected at a connecting position, which is defined as a node G that is further electrically connected to a connecting position of the second path terminal of the switch element M14 and the first path terminal of the switch element M15. A first path terminal of the switch element M17 is also for receiving the second derivative voltage $V_{AVDD}/2$. Further, the second path terminal of the switch element M15 and a second path terminal of the switch element M17 are electrically connected at a connecting position, which serves as an output terminal of the second auxiliary voltage providing circuit 321 to output the second auxiliary voltage V1P65.

Figure 8:
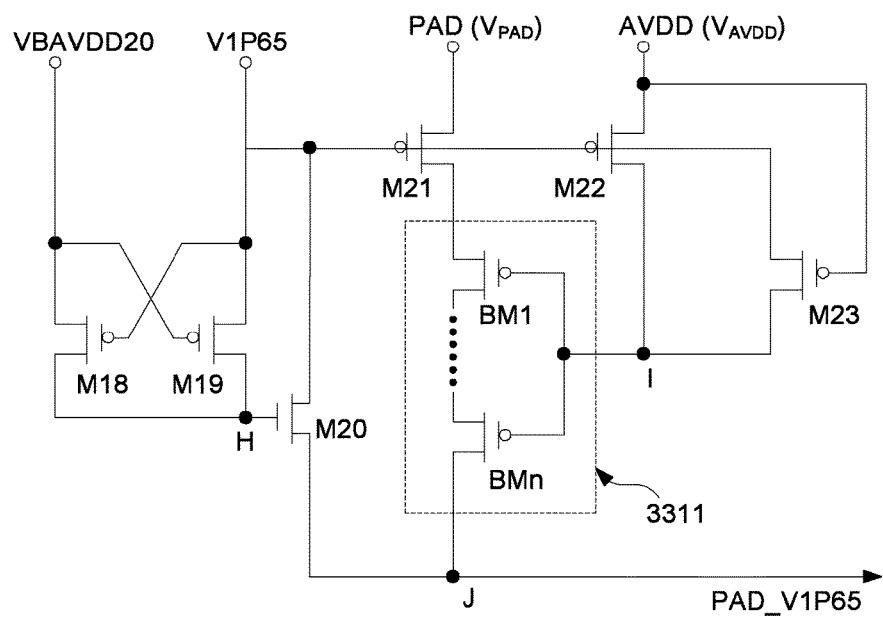
FIG. 8 is a schematic diagram of a first auxiliary voltage providing circuit in FIG. 5.

FIG. 8 shows a schematic diagram of the first auxiliary voltage providing circuit 331 in FIG. 5. As shown in FIG. 8, the first auxiliary voltage providing circuit 331 includes switch elements M18 to M23 and a buffer switch group 3311. In this embodiment, the switch elements M18, M19, M21 and M22 are each implemented by a PMOS transistor, and the switch element M20 is implemented by an NMOS transistor.

Specifically, a control terminal of the switch element M18 is electrically connected to the second auxiliary voltage providing circuit 321 to receive the second auxiliary voltage V1P65, and a first path terminal thereof is for receiving a fourth derivative voltage VBAVDD20, which is also derived by processing the first voltage $V_{AVDD}$ provided by the first voltage source AVDD (e.g., a division process). When the first voltage $V_{AVDD}$ is the high voltage 3.3 V, the voltage value of the fourth derivative voltage VBAVDD20 is smaller than the first voltage $V_{AVDD}$ and greater than the second auxiliary voltage V1P65. In this embodiment, when the first voltage $V_{AVDD}$ is the high voltage 3.3 V, the voltage value of the fourth derivative voltage VBAVDD20 derived from the first voltage $V_{AVDD}$ may be set to 2.0 V.

A control terminal of the switch element M19 is also for receiving the fourth derivative voltage, and a first path terminal thereof is electrically connected to the second auxiliary voltage providing circuit 321 to receive the second auxiliary voltage V1P65. A second path terminal of the switch element M18 and a second path terminal of the switch element M19 are connected at a connecting position, which is defined as a node H. A control terminal of the switch element M20 is electrically connected to the node H, and a first path terminal thereof is electrically connected to the second auxiliary voltage providing circuit 321 to receive the second auxiliary voltage V1P65. A first path terminal of the switch element M21 is electrically connected to the second voltage source PAD to receive the second voltage $V_{PAD}$. A first path terminal of the switch element M22 is electrically connected to the first voltage source AVDD to receive the first voltage $V_{AVDD}$, and control terminals of the switch element M21 and the switch element M22 are electrically connected together and jointly electrically connected to the second auxiliary voltage providing circuit 321 to receive the second auxiliary voltage V1P65. A control terminal of the switch element M23 and the first path terminal of the switch element M22 are electrically connected together and are jointly electrically connected to the first voltage source AVDD to receive the first voltage $V_{AVDD}$. A first terminal of the switch element M23 is electrically connected to the control terminal of the switch element M21 and the control terminal of the switch element M22, and the two are jointly electrically connected to the second auxiliary voltage providing circuit 321 to receive the second auxiliary voltage V1P65. A second path terminal of the switch element M22 and a second path terminal of the switch element M23 are electrically connected at a connecting position, which is defined as a node I.

The buffer switch group 3311 consists of at least one buffer switch. In this embodiment, the buffer switch group 3311 may include multiple buffer switches, for example, the buffer switches BM1 to BMn in FIG. 8. Control terminals of the buffer switches BM1 to BMn are connected together to serve as a control terminal of the buffer switch group 3311, wherein the control terminal of the buffer switch group 3311 is electrically connected to the node I. The buffer switches BM1 to BMn are cascaded, wherein a first path terminal of the buffer switch BM1 serves as a first path terminal of the buffer switch group 3311 and is electrically connected to the second path terminal of the switch element M21. A second path terminal of the last buffer switch BMn serves as a second path terminal of the buffer switch group 3311, and is electrically connected to the second path terminal of the switch element M20 at a connecting position defined as a node J. The node J serves as an output terminal of the first auxiliary voltage providing circuit 331 to output the first auxiliary voltage PAD_V1P65. In this embodiment, the buffer switches BM1 to BMn in the buffer switch group 3311 may each be implemented by a PMOS transistor.

Referring to FIG. 5, in this embodiment, the control voltage providing circuit 310 may be a voltage converter, which receives a control voltage RT18 that switches between a high voltage 1.8 V and a low voltage 0 V. The control voltage providing circuit 310 may convert, according to the floating voltage $V_{FLOAT}$ provided by the floating voltage providing circuit 320 and the second auxiliary voltage providing circuit V1P65 provided by the second auxiliary voltage providing circuit 321, the control voltage RT18 to a control voltage RT33 that switches between a high voltage 3.3 V and a low voltage 1.65 V.

Operation principles of the input/output circuit 300 of this embodiment are given in detail below.

Referring to FIG. 7 showing the second auxiliary voltage providing circuit 321, when the first voltage $V_{AVDD}$ provided by the first voltage source VADD is a high voltage 3.3 V and the second voltage $V_{PAD}$ provided by the second voltage source PAD is a low voltage 0 V, the first derivative voltage $V_{PAD}/2$ is 0 V, the second derivative voltage $V_{AVDD}/2$ is 1.65 V, and the third derivative voltage $V_{AVDD}/4$ is 0.825 V at this point. Thus, the switch elements M14 and M15 are cut off, and the switch elements M16 and M17 are conducted. At this point, the second derivative voltage $V_{AVDD}/2$ passes through the conducted switch element M17 and is transmitted to the output terminal of the second auxiliary voltage providing circuit 321, that is, the second auxiliary voltage V1P65 outputted by the output terminal of the second auxiliary voltage providing circuit 321 at this point is the second derivative voltage $V_{AVDD}/2$, i.e., 1.65 V.

When the first voltage $V_{AVDD}$ provided by the first voltage source AVDD is the low voltage 0 V and the second voltage $V_{PAD}$ provided by the second voltage source PAD is the high voltage 3.3 V, the first derivative voltage $V_{PAD}/2$ is 1.65 V, the second derivative voltage $V_{AVDD}/2$ is 0 V, and the third derivative voltage $V_{AVDD}/4$ is 0 V at this point. Thus, the switch elements M14 and M15 are conducted, and the switch elements M16 and M17 are cut off. At this point, the first derivative voltage $V_{PAD}/2$ passes through the conducted switch elements M14 and M15 and is transmitted to the output terminal of the second auxiliary voltage providing circuit 321; that is to say, at this point, the second auxiliary voltage V1P65 outputted by the output terminal of the second auxiliary voltage providing circuit 321 is the first derivative voltage $V_{PAD}/2$, i.e., 1.65 V.

When the first voltage $V_{AVDD}$ provided by the first voltage source AVDD is the high voltage 3.3 V and the second voltage $V_{PAD}$ provided by the second voltage source PAD is the high voltage 3.3 V, the first derivative voltage $V_{PAD}/2$ is 1.65 V, the second derivative voltage $V_{AVDD}/2$ is 1.65 V, and the third derivative voltage $V_{AVDD}/4$ is 0.825 V at this point. Thus, the switch elements M14 and M15 are cut off, and the switch elements M16 and M17 are conducted. At this point, the second derivative voltage $V_{AVDD}/2$ passes through the conducted switch element M17 and is transmitted to the output terminal of the second auxiliary voltage providing circuit 321; that is to say, at this point, the second auxiliary voltage V1P65 outputted by the output terminal of the second auxiliary voltage providing circuit 321 is the second derivative voltage $V_{AVDD}/2$, i.e., 1.65 V.

That is to say, in all of the three situations above, the second auxiliary voltage V1P65 provided by the second auxiliary voltage providing circuit 321 is 1.65 V, i.e., one-half of the first voltage $V_{AVDD}$ or the second voltage $V_{PAD}$ is at the high voltage.

Referring to FIG. 6, when the first voltage $V_{AVDD}$ provided by the first voltage source AVDD is the high voltage 3.3 V and the second voltage $V_{PAD}$ provided by the second voltage source PAD is also the high voltage 3.3 V, as described above, the second auxiliary voltage V1P65 is 1.65 V (e.g., one-half of the first voltage $V_{AVDD}$). Thus, switch element M10 is conducted, and the switch element M9 is also conducted. At this point, the first voltage $V_{AVDD}$ at the high voltage 3.3 V passes through the switch element M10 and is transmitted to the control terminal of the switch element M11, and the second voltage $V_{PAD}$ at the high voltage 3.3 V passes through the switch element M9 and is transmitted to the first path terminal of the switch element M11. Thus, the voltages at the control terminal and the first path terminal of the switch element M11 are both 3.3 V, and the switch element M11 is cut off.

Because the control terminal and the second path terminal of the switch element M12 are connected together, the switch element M12 achieves the function of voltage transmission and transmits the voltage at the first path terminal to the second path terminal. Further, because the switch element M12 contains a certain amount of impedance, when the voltage at the second path terminal reaches a certain level, the switch element M12 is cut off to prevent the voltage at the second path terminal from continue to rise. In this embodiment, the voltage transfer percentage of the switch element M12 may be set to 95%. As the first path terminal of the switch element M12 receives through the conducted switch element M9 the second voltage $V_{PAD}$ at the high voltage 3.3 V, after the voltage transfer of the switch element M12, the voltage at the node E reaches 3.3 V×95%=3.135 V.

At this point, the first voltage $V_{AVDD}$ at the high voltage 3.3 V further passes through the switch element M10 and is transmitted to the first path terminal of the switch element M13, and the control terminal of the switch element M13 receives the voltage 3.135 V at the node E, and thus the switch element M13 is conducted.

As such, the first voltage $V_{AVDD}$ at the high voltage 3.3 V passes through the conducted switch elements M10 and M13 and is transmitted to the output terminal of the floating voltage providing circuit 320, such that the floating voltage $V_{FLOAT}$ provided by the floating voltage providing circuit 320 is the first voltage $V_{AVDD}$ at the high voltage 3.3 V.

When the first voltage $V_{AVDD}$ provided by the first voltage source AVDD is the high voltage 3.3 V and the second voltage $V_{PAD}$ provided by the second voltage source PAD is the low voltage 0 V, as previous described, the second auxiliary voltage V1P65 is 1.65 V (i.e., one-half of the first voltage $V_{AVDD}$). Thus, the switch element M10 is conducted, and the switch element M9 is cut off. At this point, the first voltage $V_{AVDD}$ at the high voltage 3.3 V passes through the conducted switch element M10 and is transmitted to the control terminal of the switch element M11, and thus the switch element M11 is also cut off.

The switch element M11 is also cut off because the switch element M9 is cut off. Thus, the connecting position between the second path terminal of the switch element M9 and the first path terminal of the switch element M11 is not charged, and the voltage level thereon is lower. Thus, the voltage level of the voltage transmitted through the switch element M12 to the node E is also lower.

At this point, the first voltage $V_{AVDD}$ at the high voltage 3.3 V passes through the conducted switch element M10 and is transmitted to the first path terminal of the switch element M13, the voltage value of the voltage received by the control terminal of the switch element M13 at the node E is lower, and thus the switch element M13 is conducted.

Thus, the first voltage $V_{AVDD}$ at the high voltage 3.3 V passes through the switch elements M10 and M13 and is transmitted to the output terminal of the floating voltage providing circuit 320, such that the floating voltage $V_{FLOAT}$ provided by the floating voltage providing circuit 320 is the first voltage $V_{AVDD}$ at the high voltage 3.3 V.

When the first voltage $V_{AVDD}$ provided by the first voltage source VADD is the low voltage 0 V and the second voltage $V_{PAD}$ provided by the second voltage source PAD is the high voltage 3.3 V, as previously described, the second auxiliary voltage V1P65 is 1.65 V (i.e., one-half of the second voltage $V_{PAD}$). Thus, the switch element M10 is cut off, and the switch element M9 is conducted. At this point, the second voltage $V_{PAD}$ at the high voltage 3.3 V passes through the switch element M9 and is transmitted to the first path terminal of the switch element M11. Because the switch element M10 is cut off and the first voltage $V_{AVDD}$ is the low voltage 0 V, the voltage transmitted to the control terminal of the switch element M11 is lower and the switch element M11 is conducted.

Because the switch element M9 is conducted, the voltage at the second path terminal of the switch element M9 is the second voltage $V_{PAD}$ at the high voltage 3.3 V, that is, the voltage at the first path terminal of the switch element M12 is the second voltage $V_{PAD}$ at the high voltage 3.3 V. At this point, after the voltage transmission through the switch element M12, the voltage value at the node E is higher and reaches 3.3 V×95%=3.135 V.

At this point, because the switch element M10 is cut off and the first voltage $V_{AVDD}$ is at the low voltage 0 V, the voltage at the second path terminal of the switch element M10 is lower, that is, the voltage at the first path terminal of the switch element M13 is lower, and the voltage at the control terminal of the switch element M13 is the voltage 3.135 V at the node E. Thus, the switch element M13 is cut off.

Therefore, at this point, the second voltage $V_{PAD}$ at the high voltage 3.3 V passes through the conducted switch elements M9 and M11 and is transmitted to the output terminal of the floating voltage providing circuit 320, such that the floating voltage $V_{FLOAT}$ provided by the floating voltage providing circuit 320 is the second voltage $V_{PAD}$ at the high voltage 3.3 V.

That is to say, in all of the three situations above, the floating voltage $V_{FLOAT}$ provided by the floating voltage providing circuit 320 is the larger between the first voltage $V_{AVDD}$ and the second voltage $V_{PAD}$, i.e., the high voltage 3.3 V.

Referring to FIG. 8, when the first voltage $V_{AVDD}$ provided by the first voltage source VADD is the high voltage 3.3 V, regardless of whether the second voltage $V_{PAD}$ provided by the second voltage source PAD is the high voltage 3.3 V or the low voltage 0 V, the fourth derivative voltage VBAVDD20 stays 2.0 V. Because the fourth derivative voltage VBAVDD20 is greater than the second auxiliary voltage V1P65 (1.65V), the switch element M18 is conducted, and the switch element M19 is cut off. The control terminal of the switch element M20 receives the fourth derivative voltage VBAVDD20 (2.0 V), and the switch element M20 is thus conducted.

At this point, the switch element M22 is conducted, and the voltage at the node I is the first voltage $V_{AVDD}$ at the high voltage 3.3 V, and the buffer switches BM1 and BM2 in the buffer switch group 3311 are both cut off.

The second auxiliary voltage V1P65 passes through the switch element M20 and is transmitted to the node J, and thus the first auxiliary voltage PAD_V1P65 outputted by the output terminal of the first auxiliary voltage providing circuit 331 is 1.65 V, i.e., the voltage value of the second auxiliary voltage V1P65.

However, when the first voltage $V_{AVDD}$ provided by the first voltage source AVDD is the low voltage 0 V and the second voltage $V_{PAD}$ provided by the second voltage source PAD is the high voltage 3.3 V, the fourth derivative voltage VBAVDD20 is 0 V, and thus the switch element M18 is cut off and the switch element M19 is conducted. The control terminal of the switch element M20 receives the second auxiliary voltage V1P65 and the first terminal of the switch element M20 also receives the second auxiliary voltage V1P65, and thus the switch element M20 is cut off.

At this point, the switch element M21 is conducted, the switch element M22 is cut off, and the switch element M23 is conducted. Thus, the second auxiliary voltage V1P65 passes through the conducted switch element M23 and is transmitted to the node I. At this point, because the switch element M21 is conducted, the second voltage $V_{PAD}$ at the high voltage 3.3 V passes through the conducted switch element M21 and is transmitted to the first path terminal of the buffer switch group 3311, such that the buffer switches BM1 to BMn in the buffer switch group 3311 are all conducted, and the second voltage $V_{PAD}$ at the high voltage 3.3 V passes through the conducted switch element M21 and the buffer switches BM1 to BMn in the buffer switch group 3311 and is transmitted to the node J. Therefore, the first auxiliary voltage PAD_V1P65 outputted by the output terminal of the first auxiliary voltage circuit 331 is 3.3 V, i.e., the second voltage $V_{PAD}$ at the high voltage 3.3 V.

Referring to FIG. 5, when the first voltage $V_{AVDD}$ provided by the first voltage source VADD is the high voltage 3.3 V and the second voltage $V_{PAD}$ provided by the second voltage source PAD is the low voltage V 0, the first auxiliary voltage PAD_V1P65 at this point is 1.65 V.

The control voltage RT33 received by the control terminal of the switch element M1 switches between 1.65 V and 3.3 V, i.e., whether the switch element M1 is conducted is determined by the control voltage RT33. When the control voltage RT33 is 1.65 V, the switch element M1 is conducted, and the switch element M8 is conducted at the same time. When the control voltage RT33 is 3.3 V, the switch element M1 is cut off and the switch element M8 is also cut off. At this point, the floating voltage $V_{FLOAT}$ received by the base terminals of the switch elements M1 and M8 is also 3.3 V, and thus no leakage current is generated between the first voltage source AVDD and the base terminals of the switch elements M1 and M8.

When the first voltage $V_{AVDD}$ provided by the first voltage source VADD is the high voltage 3.3 V and the second voltage $V_{PAD}$ provided by the second voltage source PAD is also the high voltage 3.3 V, the first auxiliary voltage PAD_V1P65 at this point is still 1.65 V, and so the switch element M8 is conducted. Whether the switch element M1 is conducted is determined by the control voltage RT33. At this point, the floating voltage $V_{FLOAT}$ received by the base terminals of the switch elements M1 and M8 is also 3.3 V, and thus no leakage current is generated between the first voltage source AVDD or the second voltage source PAD and the base terminals of the switch elements M1 and M8.

When the first voltage $V_{AVDD}$ provided by the first voltage source VADD is the low voltage 0 V and the second voltage $V_{PAD}$ provided by the second voltage source PAD is the high voltage 3.3 V, the first auxiliary voltage PAD_V1P65 at this point is 3.3 V (i.e., the voltage value of the second voltage $V_{PAD}$).

Because the first voltage $V_{AVDD}$ is the low voltage 0 V, regardless of what the control voltage RT33 is, the switch element M1 is always cut off. Further, because the first auxiliary voltage PAD_V1P65 is 3.3 V, the switch element M8 is also cut off. It should be noted that, the switch element M1 is a second-type device capable of withstanding only a 1.8-V voltage difference, the cut-off switch element M8 can prevent the second voltage $V_{PAD}$ at the high voltage 3.3 V from being transmitted to the second path terminal of the switch element M1, thus preventing the two path terminals of the switch element M1 from having to withstand a higher voltage difference (a 3.3-V voltage difference). Meanwhile, the floating voltage $V_{FLOAT}$ received by the base terminals of the switch elements M1 and M8 is also 3.3 V, and thus no leakage current is generated between the second voltage source PAD and the base terminals of the switch elements M1 and M8.

In this embodiment, apart from the switch element M1, the other devices only need to withstand a voltage difference of about 1.6 V instead of being required to withstand a higher voltage difference during operations thereof. Thus, the above devices may be implemented by second-type devices, i.e., devices capable of withstanding a 1.8-V voltage difference, in order to stay functional.

For example, for the switch element M1, when the first voltage $V_{AVDD}$ is the high voltage 3.3 V, because the control voltage RT33 switches between 1.65 V and 3.3 V to control whether to conduct the switch element M1, the switch element M1 only needs to withstand a voltage of about 1.65 V. When the first voltage $V_{AVDD}$ is the low voltage 0 V and the second voltage $V_{PAD}$ is the high voltage 3.3 V, as the switch element M8 in the protection circuit 330 is cut off, the second voltage $V_{PAD}$ at the high voltage 3.3 V is prevented from being transmitted to the second path terminal of the switch element M1, thus preventing the switch element M1 from having to withstand a larger voltage difference.

For the switch element M9 or M10 in the floating voltage providing circuit 320, because the second auxiliary voltage V1P65 is 1.65 V in all of the three situations above, the switch element M9 or M10 stays at the low voltage 0 V regardless of whether the first voltage $V_{AVDD}$ or the second voltage $V_{PAD}$ is the high voltage 3.3 V, and only needs to withstand a voltage difference of about 1.65 V instead of a large voltage difference of 3.3 V.

Similarly, the other devices in the input/output circuit 300 of this embodiment can each be implemented by a second-type device, which needs to withstand only a 1.8-V voltage difference instead of a larger voltage difference.

As generally known, an input/output circuit is a bridge for signal transmission between a core circuit and a peripheral circuit, and most core circuits consist of core devices that cannot withstand overly high voltages. The devices in the input/output circuit 300 of this embodiment consists of second-type devices that cannot withstand overly high voltages, and thus the input/output circuit 300 of this embodiment can better match a core circuit compared to the input/output circuit 200 of the previous embodiment.

In conclusion, in the input/output circuit of the present invention, a floating voltage is provided to the base terminal FLOAT of the switch element M1 by a floating voltage providing circuit, and the floating voltage is also the larger between the first voltage $V_{AVDD}$ provided by the first voltage source and the second voltage $V_{PAD}$ provided by the second voltage source PAD. Thus, it is effectively ensured that the base terminal FLOAT of the switch element M1 is constantly shorted at all times with one of the first voltage source AVDD and the second voltage source PAD that provides the larger voltage. Therefore, regardless that the first voltage $V_{AVDD}$ provided by the first voltage source and the second voltage $V_{PAD}$ provided by the second voltage source PAD both need to switch between the high voltage 3.3 V and the low voltage 0 V, the present invention is capable of effectively preventing a leakage current from being generated between the first voltage source AVDD or the second voltage source PAD and the base terminal of the switch element M1.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An input/output circuit, comprising:
   a first switch element, comprising a control terminal, a first path terminal, a second path terminal and a base terminal, wherein the first path terminal is electrically connected to a first voltage source to receive a first voltage provided by the first voltage source, and the second path terminal is electrically connected to a second voltage source to receive a second voltage provided by the second voltage source;
   a control voltage providing circuit, electrically connected to the control terminal of the first switch element to provide a control voltage to the control terminal of the first switch element, so as to control whether to conduct the first switch element; and
   a floating voltage providing circuit, electrically connected to the base terminal of the first switch element to provide the larger between the first voltage and the second voltage to the base terminal of the first switch element, so as to prevent a leakage current from being generated between the first voltage source or the second voltage source and the base terminal of the first switch element;
   wherein the first switch element is a first-type device, components in the control voltage providing circuit and the floating voltage providing circuit are each the first-type device, and the first-type device is capable of withstanding a 3.3-V voltage difference;

wherein the floating voltage providing circuit comprises:
a second switch element, having a control terminal thereof electrically connected to the first voltage source to receive the first voltage, and a first path terminal thereof electrically connected to the second voltage source to receive the second voltage;
a third switch element, having a control terminal thereof electrically connected to the first voltage source to receive the first voltage, and a first path terminal thereof electrically connected to a second path terminal of the second switch element at a connecting position that is defined as a first node;
a fourth switch element, having a control terminal thereof electrically connected to the first node, a first path terminal thereof electrically connected to the first voltage source to receive the first voltage, and a second path terminal thereof electrically connected to a second path terminal of the third switch element at a connecting position that is defined as a second node;
wherein, the second node serves as a first output terminal of the floating voltage providing circuit to output a floating voltage to the base terminal of the first switch element, and the floating voltage is the larger between the first voltage and the second voltage.

2. The input/output circuit according to claim 1, wherein the first switch element is a p-type metal oxide semiconductor (PMOS) transistor.

3. The input/output circuit according to claim 1, wherein the second switch element, the third switch element and the fourth switch element are each a PMOS transistor.

4. The input/output circuit according to claim 3, wherein the control voltage providing circuit comprise:
a fifth switch element, having a control terminal thereof electrically connected to the first voltage source to receive the first voltage;
a sixth switch element, having a control terminal thereof electrically connected to a second output terminal of the floating voltage providing circuit; wherein, the first node of the floating voltage providing circuit serves as the second output terminal of the floating voltage providing circuit to output a voltage at the first node, a first path terminal of the fifth switch element is electrically connected to a first path terminal of the sixth switch element at a connecting position that is defined as a third node, and a second path terminal of the fifth switch element is electrically connected to the second path terminal of the sixth switch element at a connecting position that is defined as a fourth node;
a buffer, having an input terminal thereof for receiving the control voltage, and an output terminal thereof electrically connected to the third node; and
a seventh switch element, having a control terminal thereof electrically connected to the first voltage source to receive the first voltage, a first path terminal thereof electrically connected to the fourth node, and a second path terminal thereof electrically connected to the control terminal of the sixth switch element.

5. The input/output circuit according to claim 4, wherein the fifth switch element is an n-type metal oxide semiconductor (NMOS) transistor, and the sixth switch element and the seventh switch element are each a PMOS transistor.

6. The input/output circuit according to claim 1, wherein the first switch element is a second-type device, components in the control voltage providing circuit and the floating voltage providing circuit are each the second-type device, and the second-type device is a device capable of withstanding a 1.8-V voltage difference.

7. The input/output circuit according to claim 6, further comprising:
a protection circuit, provided between the first voltage source and the second voltage source, for preventing the first switch element from withstanding a voltage difference larger than 1.8 V.

8. The input/output circuit according to claim 7, wherein the protection circuit comprises:
a first auxiliary voltage providing circuit, providing a first auxiliary voltage; and
an eighth switch element, comprising a control terminal, a first path terminal, a second path terminal and a base terminal, wherein the control terminal is electrically connected to the first auxiliary voltage providing circuit to receive the first auxiliary voltage to further determine whether to conduct the eighth switch element, the first path terminal is electrically connected to the second path of the first switch element, and the second path terminal is electrically connected through a resistor to the second voltage source to receive the second voltage;
wherein, the base terminal of the eighth switch element is electrically connected to the floating voltage providing circuit to receive the larger between the first voltage and the second voltage, so as to prevent the leakage current from being generated between the first voltage source or the second voltage source and the base terminal of the eighth switch element.

9. The input/output circuit according to claim 8, wherein the eighth switch element is a PMOS transistor.

10. The input/output circuit according to claim 9, wherein the floating voltage providing circuit comprises:
a ninth switch element, having a first path terminal thereof electrically connected to the second voltage source to receive the second voltage;
a tenth switch element, having a first path terminal thereof electrically connected to the first voltage source to receive the first voltage;
a second auxiliary voltage providing circuit, providing a second auxiliary voltage; wherein, control terminals of the ninth switch element and the tenth switch element are both electrically connected to the second auxiliary voltage providing circuit to receive the second auxiliary voltage;
an eleventh switch element, having a first path terminal thereof electrically connected to a second path terminal of the ninth switch element;
a twelfth switch element, having a first path terminal thereof electrically connected to a connecting position of the second path terminal of the ninth switch element and the first path terminal of the eleventh switch element, and a control terminal thereof electrically connected to a second path terminal thereof at a connecting position that is defined as a fifth node;
and a thirteenth switch element, having a control terminal thereof electrically connected to the fifth node, and a first path terminal thereof electrically connected to a second path terminal of the tenth switch element; wherein, a control terminal of the eleventh switch element is electrically connected to a connecting position of the second path terminal of the tenth switch element and the first path terminal of the thirteenth switch element, and a second path terminal of the eleventh switch element is electrically connected to a second path terminal of the thirteenth switch element at a connecting position that is defined as a sixth node;

wherein, the sixth node serves as an output terminal of the floating voltage providing circuit to output the floating voltage to the base terminal of the first switch element and the base terminal of the eighth switch element, and the floating voltage is the larger between the first voltage and the second voltage.

11. The input/output circuit according to claim 10, wherein the ninth switch element, the tenth switch element, the eleventh switch element, the twelfth switch element and the thirteenth switch element are each a PMOS transistor.

12. The input/output circuit according to claim 11, wherein the second auxiliary voltage providing circuit comprises:
   a fourteenth switch element, having a first path terminal thereof receiving a first derivative voltage, wherein the first derivative voltage is one-half of the second voltage provided by the second voltage source;
   a fifteenth switch element, having a first path terminal thereof electrically connected to a second path terminal of the fourteenth switch element; wherein, control terminals of the fourteenth switch element and the fifteenth switch element are electrically connected and are for receiving a second derivative voltage, and the second derivative voltage is one-half of the first voltage provided by the first voltage source;
   a sixteenth switch element, having a control terminal thereof receiving the second derivative voltage, and a first path terminal thereof receiving a third derivative voltage, wherein the third derivative voltage is one-quarter of the first voltage provided by the first voltage source; and
   a seventeenth switch element, having a control terminal thereof electrically connected to a second path terminal of the sixteenth switch element at a connecting position that is defined as a seventh node; wherein, the seventh node is further electrically connected to a connecting position of the second path terminal of the fourteenth switch element and the first path terminal of the fifteenth switch element, and a first path terminal of the seventeenth switch element is for receiving the second derivative voltage;
   wherein, a second path terminal of the fifteenth switch element is electrically connected to a second path terminal of the seventeenth switch element to serve as an output terminal of the second auxiliary voltage providing circuit to output the second auxiliary voltage.

13. The input/output circuit according to claim 12, wherein the fourteenth switch element, the fifteenth switch element and the seventeenth switch element are each an PMOS transistor, and the sixteenth switch element is an NMOS transistor.

14. The input/output circuit according to claim 13, wherein the first auxiliary voltage providing circuit comprises:
   an eighteenth switch element, having a control terminal thereof electrically connected to the second auxiliary voltage to receive the second auxiliary voltage, and a first path terminal for receiving a fourth derivative voltage; wherein, the fourth derivative voltage is derived from processing the first voltage provided by the first voltage source, and the fourth derivative voltage is smaller than the first voltage and greater than the second auxiliary voltage when the first voltage is at a high-voltage status;
   a nineteenth switch element, having a control terminal thereof receiving the fourth derivative voltage, and a first path terminal thereof electrically connected to the second auxiliary voltage providing circuit to receive the second auxiliary voltage; wherein, a second path terminal of the eighteenth switch element is electrically connected to a second path terminal of the nineteenth switch element at a connecting position that is defined as an eighth node;
   a twentieth switch element, having a control terminal thereof electrically connected to the eighth node, and a first path terminal thereof electrically connected to the second auxiliary voltage providing circuit to receive the second auxiliary voltage;
   a twenty-first switch element, having a first path terminal thereof electrically connected to the second voltage source to receive the second voltage;
   a twenty-second switch element, having a first path terminal thereof electrically connected to the first voltage source to receive the first voltage; wherein, a control terminal of the twenty-first switch element and a control terminal of the twenty-second switch element are electrically connected and the two are jointly electrically connected to the second auxiliary voltage providing circuit to receive the second auxiliary voltage;
   a twenty-third switch element, having a control terminal thereof electrically connected to the first path terminal of the twenty-second switch element and the two are jointly electrically connected to the first voltage source to receive the first voltage, and a first path terminal thereof electrically connected to the control terminal of the twenty-first switch element and the two are jointly electrically connected to the second auxiliary voltage providing circuit to receive the second auxiliary voltage; wherein, a second path terminal of the twenty-second switch element is electrically connected to a second path terminal of the twenty-third switch element at a connecting position that is defined as a ninth node; and
   a buffer switch group, consisting of at least one buffer switch, comprising a control terminal, a first path terminal and a second path terminal; wherein, the control terminal of the switch buffer group is electrically connected to the ninth node, the first path terminal is electrically connected to a second path terminal of the twenty-first switch element, and the second path terminal is electrically connected to a second path terminal of the twentieth switch element at a connecting position that is defined as a tenth node;
   wherein, the tenth node serves as an output terminal of the first auxiliary voltage providing circuit to output the first auxiliary voltage.

15. The input/output circuit according to claim 14, wherein the eighteenth switch element, the nineteenth switch element, the twenty-first switch element, the twenty-second switch element and the twenty-third switch element are each a PMOS transistor, and the twentieth switch element is an NMOS transistor.

16. The input/output circuit according to claim 14, wherein the buffer switch group comprises a plurality of buffer switches, and the control terminals of the buffer switches are electrically connected to serve as the control terminal of the buffer switch group, the buffer switches are cascaded, the first path terminal of the first of the buffer switches serves as the first path terminal of the buffer switch group, and the second path terminal of the last of the buffer switches serves as the second path terminal of the buffer switch group.

17. The input/output circuit according to claim 14, wherein at least one buffer switch in the buffer switch group is a PMOS transistor.

\* \* \* \* \*